US006950313B1

(12) United States Patent
Shih

(10) Patent No.: US 6,950,313 B1
(45) Date of Patent: Sep. 27, 2005

(54) INTERFACE CARD FASTENER

(75) Inventor: Yu-Lin Shih, Taipei (TW)

(73) Assignee: Avance Technologies Inc., Taipei (TW)

(*) Notice: Subject to any disclaimer, the term of this patent is extended or adjusted under 35 U.S.C. 154(b) by 0 days.

(21) Appl. No.: 10/900,678

(22) Filed: Jul. 27, 2004

(51) Int. Cl.[7] ........................... H05K 5/00; H05K 5/04; H05K 5/06

(52) U.S. Cl. ...................... 361/759; 361/686; 361/732; 361/740; 361/741; 361/747; 361/756; 361/801; 361/802; 439/327; 439/61

(58) Field of Search ................................ 361/686, 726, 361/732, 740, 741, 747, 756, 759, 801, 802; 211/41.17; 312/223.2; 439/325–328, 61

(56) References Cited

U.S. PATENT DOCUMENTS

| | | | | |
|---|---|---|---|---|
| 5,601,349 | A * | 2/1997 | Holt | 312/265.6 |
| 6,215,668 | B1 * | 4/2001 | Hass et al. | 361/759 |
| 6,231,139 | B1 * | 5/2001 | Chen | 312/223.2 |
| 6,487,089 | B1 * | 11/2002 | Otis | 361/796 |
| 6,625,034 | B2 * | 9/2003 | Davis et al. | 361/759 |
| 6,634,898 | B2 * | 10/2003 | Clements | 439/327 |
| 6,693,800 | B1 * | 2/2004 | Lin et al. | 361/759 |
| 6,775,147 | B2 * | 8/2004 | Kim et al. | 361/752 |
| 2003/0107878 | A1 * | 6/2003 | Kaminski | 361/759 |
| 2004/0052063 | A1 * | 3/2004 | Megason et al. | 361/801 |
| 2004/0174687 | A1 * | 9/2004 | Wang et al. | 361/801 |

* cited by examiner

*Primary Examiner*—Phuong T. Vu
(74) *Attorney, Agent, or Firm*—Pro-Techtor Int'l Services

(57) ABSTRACT

The present invention relates to an interface card fastener, which is set in a computer system host or any other electronic device comprising expansion slots, comprising a bracket and a plurality of pivot assemblies. The bracket is set upon the frame above the expansion slots inside the chassis, and comprises a back frame engaged with the chassis and a plurality of the inner frames extended from the back frame. Each two inner frames define a fasten chamber, and the back frame comprises a horizontal extended L-shape hook in the appropriate position. The pivot assembly is set in the fastener chamber, which rotates between the fastening and the release positions of the interface card, and comprises a hook and a handle linked with the hook. To operate the fastener, pushing the handle directly to hook with the L-shape hook or unhook in interface card positioning, which is easy operating and stable positioning.

7 Claims, 11 Drawing Sheets

INTERFACE CARD FASTENER

BACKGROUND OF THE INVENTION

1. Field of the Invention

The present invention relates to an interface card fastener, which set in computer chassis or any other electronic devices comprising expansion interface card slots, especially to a device that can be easily pushed to fasten and pulled to release a single card with no further need of tools or hardware. The fastener in this present invention can be easily handled to fasten interface cards stably.

2. Description of the Related Art

Electronics industries develop and upgrade soon. In a computer system, many different devices and peripherals are collocated to work. Nowadays most devices and peripherals are designed to "Plug-n-Play" compliant for more convenient use. Various kinds of interface cards are common used to upgrade a computer system to enhance efficacy. For example, interface cards, like sound cards, graphic cards, network cards, or many other multimedia interface cards, are used as a bridge to connect host and other hardware, thus interface cards are changed or swapped due to installation, replacement, or upgrade of computer systems from time to time. To make sure the interface cards are installed stably and fixed in card slots, there are several prior arts in this skill to fasten interface cards.

The most common traditional method utilizes a screw to fasten interface card into the slot. To screw interface card, user needs extra a screwdriver to work. Screwing is the most inconvenient work to swap interface card. Screw is small and cause risk to damage other electronic device like mainboard when falling. Magnetic screwdriver that common used in screwing also does not suit to screw in electronic device.

Most common prior arts in this skill attempted to fasten interface card without screw. In a prior art, as shown in FIG. 1, an interface card retainer 7 is set in a computer host, which comprises a chassis 10, a mainboard 11 set in the chassis 10, and a plurality of expansion slot 12, wherein a interface card 13 is installed in the expansion slot 12 to connect and communicate with the mainboard 11. Inside the chassis 10 corresponding to the expansion slot 12 and the interface card 13, an oblong frame 14 is set to fit a bulkhead 131 of the interface card 13 installing. A long batten 71 of the retainer 7 presses a bulkhead top 132 of the bulkhead 131, wherein two ends 72, 73 of the retainer 7 are conjugated with corresponding devices (not shown in FIG. 1) inside the chassis 10, and a ear 133 of the bulkhead 131 is screwed with the interface card 13 to fix the card 13 in the slot 12.

In the foregoing design of retainer 7, a purpose of screw free to fix the bulkhead 131 with the frame 14 is achieved, and interface cards swapping can be easily operated with no extra tool needed. However, the only single batten 71 presses all bulkheads 131 of interface cards 13 to fix. Once swapping single one of the interface cards 13, the batten 71 of the retainer 7 should be opened and all other cards are released. This will be a serious defect when utilizing this design in an interfaced card hot-swappable computer system, which most is server.

Another prior art is an interface card fixing device 8, as shown in FIG. 2, which comprises a bracket 81 and a plurality of U-shape glands 82 which can slide along the bracket 81. On both sides of each the gland 82 and corresponding inner of the bracket 81 comprise a set of racks 83 and 84 respectively. With the racks 83 and 84 gearing, the gland 82 and press the bulkhead 131 in a specific and stable position.

Compare with the retainer 7, the fixing device 8 can press and release each the bulkhead 131 independently with the gland 82, but the teeth of the rack will be abraded after repeat operations and the abrasion affects the fixing.

FIG. 3 illustrates an interface card latch 9, which comprises a bracket 91, a plurality of pivot devices 92, a buckle 93 and a spring 94 to press or release the bulkhead 131 without screw. The buckle 93 comprises a button 931, a handle 932, and two bars 933 on both sides of the handle 932. The bar 933 is set to fix the pivot device 92. The structures of the pivot device 92 and the buckle 93 are complicated and hard to manufacture. Besides, the buckle 93 utilizes the spring 94 to control and fix the pivot 92, but the spring 94 has risk of elastic deformation.

Therefore, a need exists for a fastener, which has simple structure and is easy to use, to secure the interface card in place.

SUMMARY OF THE INVENTION

Accordingly, the primary object of the present invention is to provide an interface card securing device, which is easy to handle and stably to secure the interface card.

To achieve the object, the present invention provides an interface card fastener to utilize in a computer system or other electronic devices comprising interface cards. The computer system or the electronic device comprises a mainboard set in a chassis, and a plurality of expansion slots on the mainboard. The chassis forms an interface card bay corresponding to each bulkhead of interface card and card slot to position. The fastener comprises a bracket and a plurality pivot assemblies. Said bracket is set on the upside of card bay in the inner chassis, which comprises a back frame against the backplane of the chassis and a plurality of inner frames extending toward inside the chassis. Each two inner frames define a fastener chamber, and inside the back frame in each the fastener chamber comprises a horizontal extended L-shape hook. The pivot assembly is set in the fastener chamber, and comprises a hook and a handle. The pivot assembly can be easily switched between a fastening position and a release position in the fastener chamber, and the fastener can fastening or release a single interface card simply with the handle pushing the hook into or pulling it out of the L-shape hook.

Each the inner frame comprises a bearing hole, which can set the pivot assembly as an axle center to rotate. The back frame below the L-shape hook comprises a prominent crosspiece, which positions the pivot assembly. The pivot assembly comprises two aprons on both sides to fasten the interface card preventing horizontal movement, and a press board, wherein also comprises a engagement body, to fasten the interface card preventing 2-dimensional vertical and horizontal movements.

Comparing with prior arts, the present invention discloses an interface card fastener, which positions cards more stably and operations easier. With a bracket and a plurality of pivot assemblies, this present design utilizes a handle, which drives a hook to fasten with or release from a L-shape hook of the bracket, to position and secure an interface card. With no complex structure and difficult operation, the present invention is durable and stably positioning, which can satisfy various applications with economic efficiency.

The various objects and advantages of the present invention will be more readily understood from the following detailed description when read in conjunction with the appended drawings.

BRIEF DESCRIPTION OF THE DRAWINGS

FIG. 1 illustrates a perspective view of a prior art a;

DETAILED DESCRIPTION OF THE INVENTION

In the following, a better embodiment of this invention is described with figures for further details.

Figure 1:
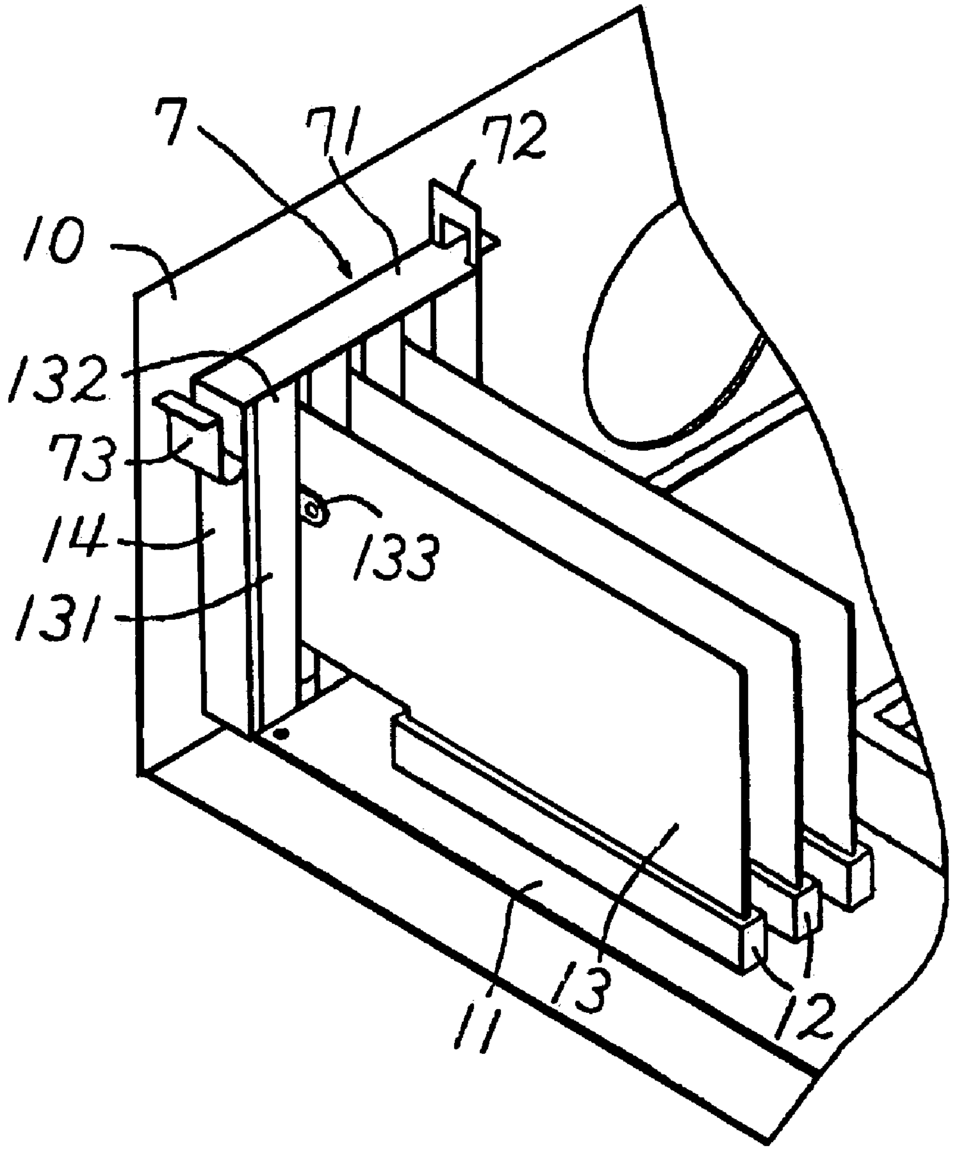
Figure 2:
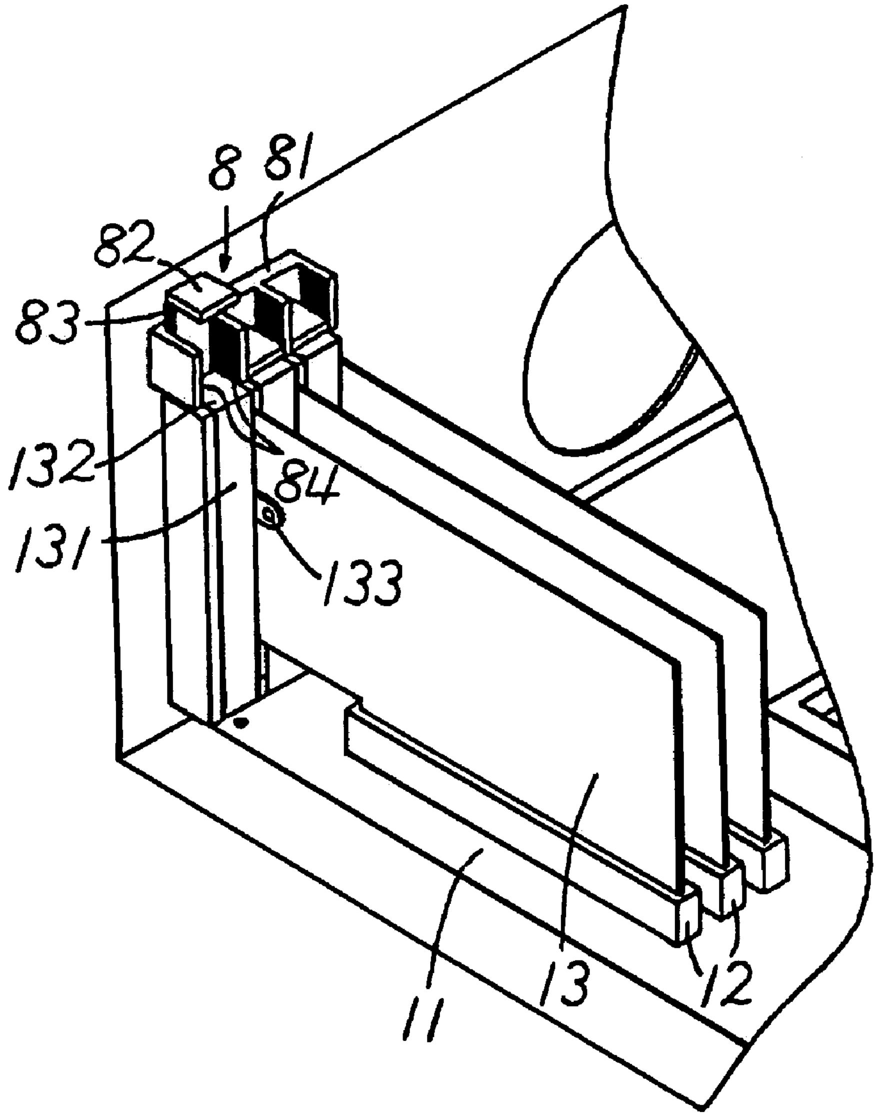
FIG. 2 illustrates a perspective view of a prior art b.
Figure 3:
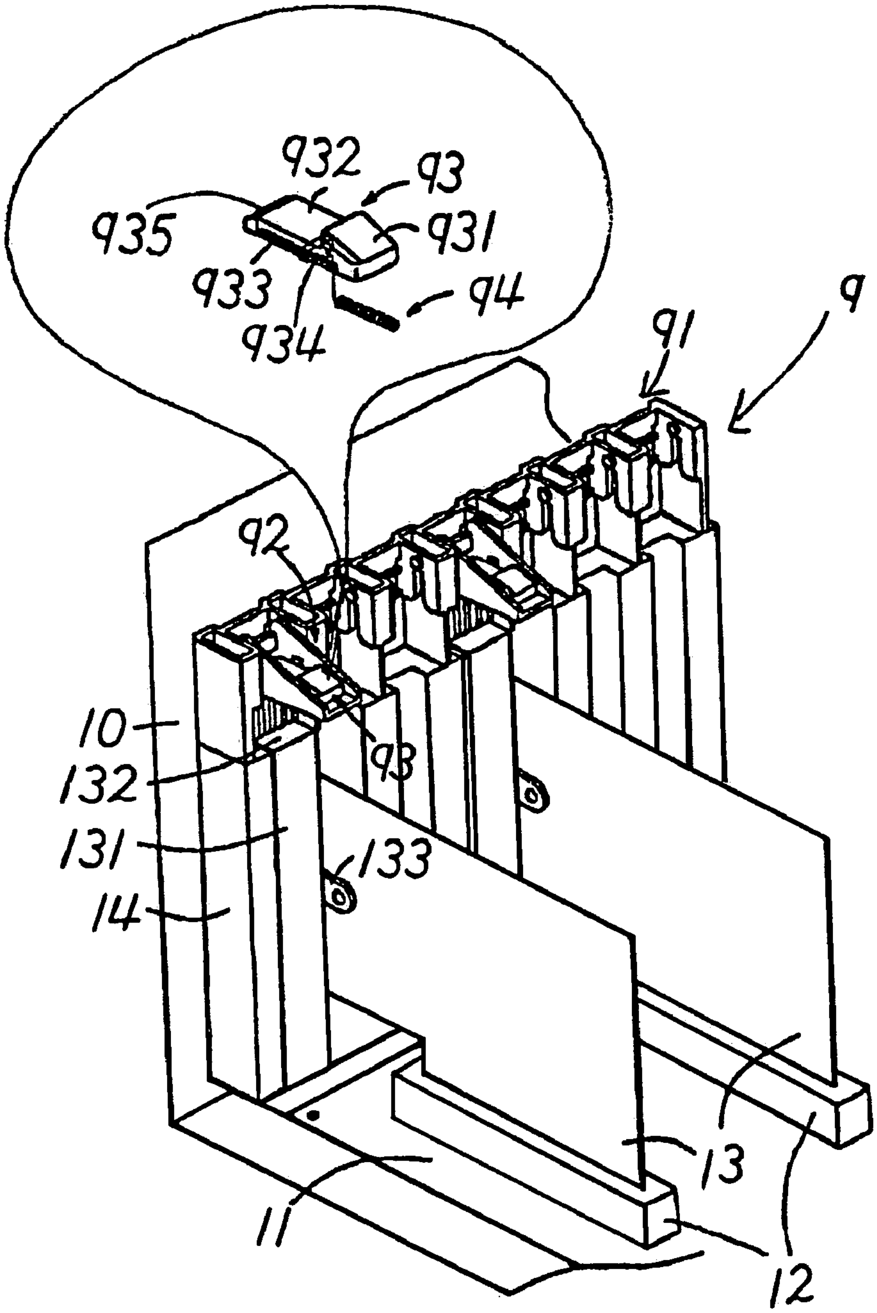
FIG. 3 illustrates a perspective view of a prior art c.
Figure 4:
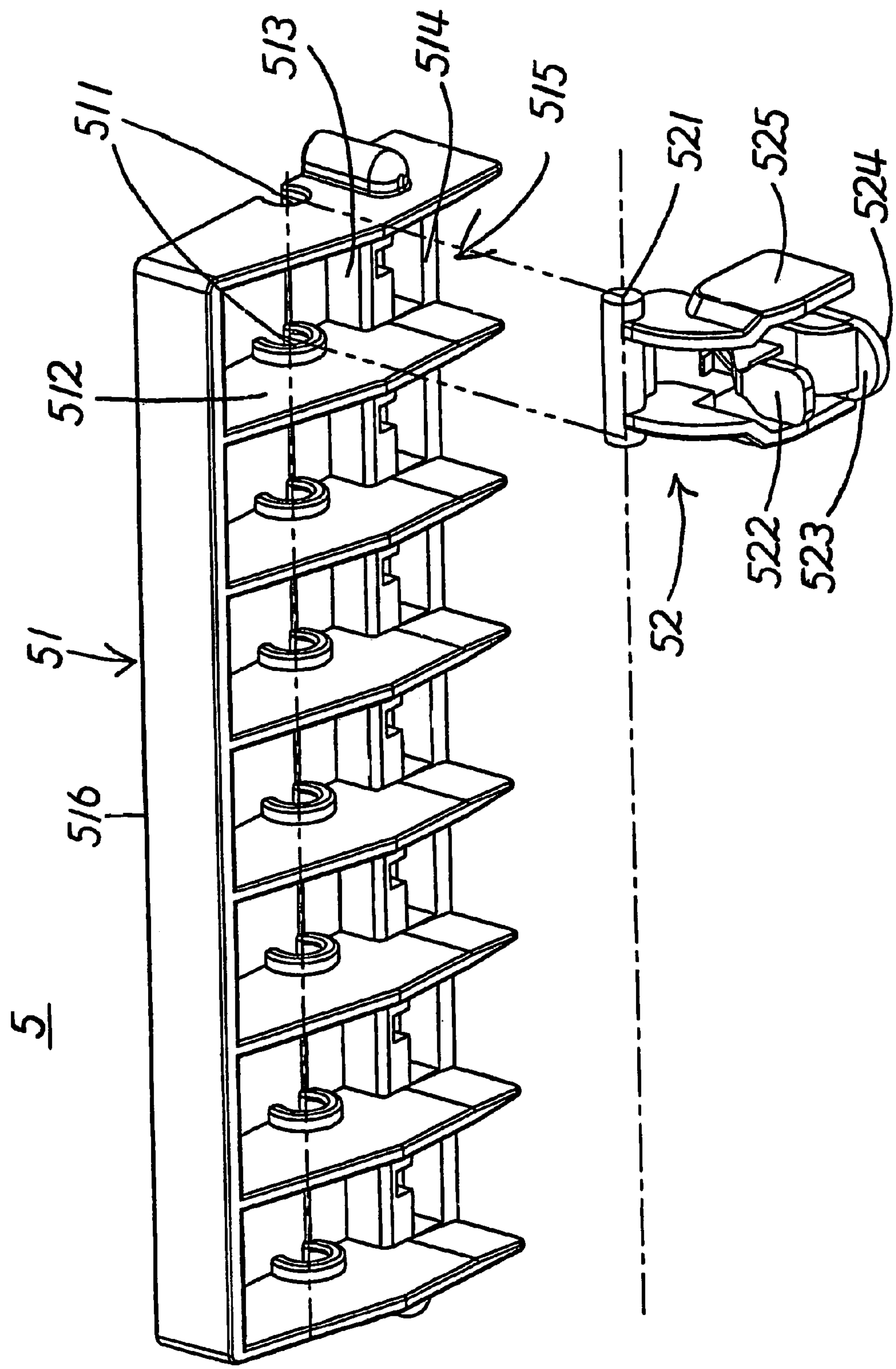
FIG. 4 illustrates an exploded perspective view of an embodiment of the present invention.

FIG. 4 is an exploded perspective view of this embodiment. An interface card fastener 5 is set in a computer system or other electronic devices with expansion slots. The interface card fastener comprises a bracket 51 and a plurality of pivot assemblies 52. Said bracket 51 comprises a back frame 516 set in computer chassis and a plurality of inner frames 512 extended toward inside of computer chassis from the back frame 516. Each two inner frames 512 define a fastener chamber 515, inside the back frame 516 in each the fastener chamber 515 comprises a horizontal extended L-shape hook 513, and each the inner frame 512 comprises a bearing hole 511, which can set said pivot assembly 52 as an axle center to rotate in the fastener chamber 515. The back frame 516 below the L-shape hook 513 comprises a prominent crosspiece 514, which positions the pivot assembly 52. The pivot assembly 52 is set in the fastener chamber 515 of the bracket 51, and comprises a hook 526 (shown in FIG. 6) and a handle 522. Said handle 522 drives said hook 526 to hook and position. Furthermore, the pivot assembly 52 comprises two aprons 525 on both sides, and a press board 523, wherein also comprises a engagement body 524 in front. The pivot assembly 52 also comprises a cannular pivot 521 on upside.

Figure 5:
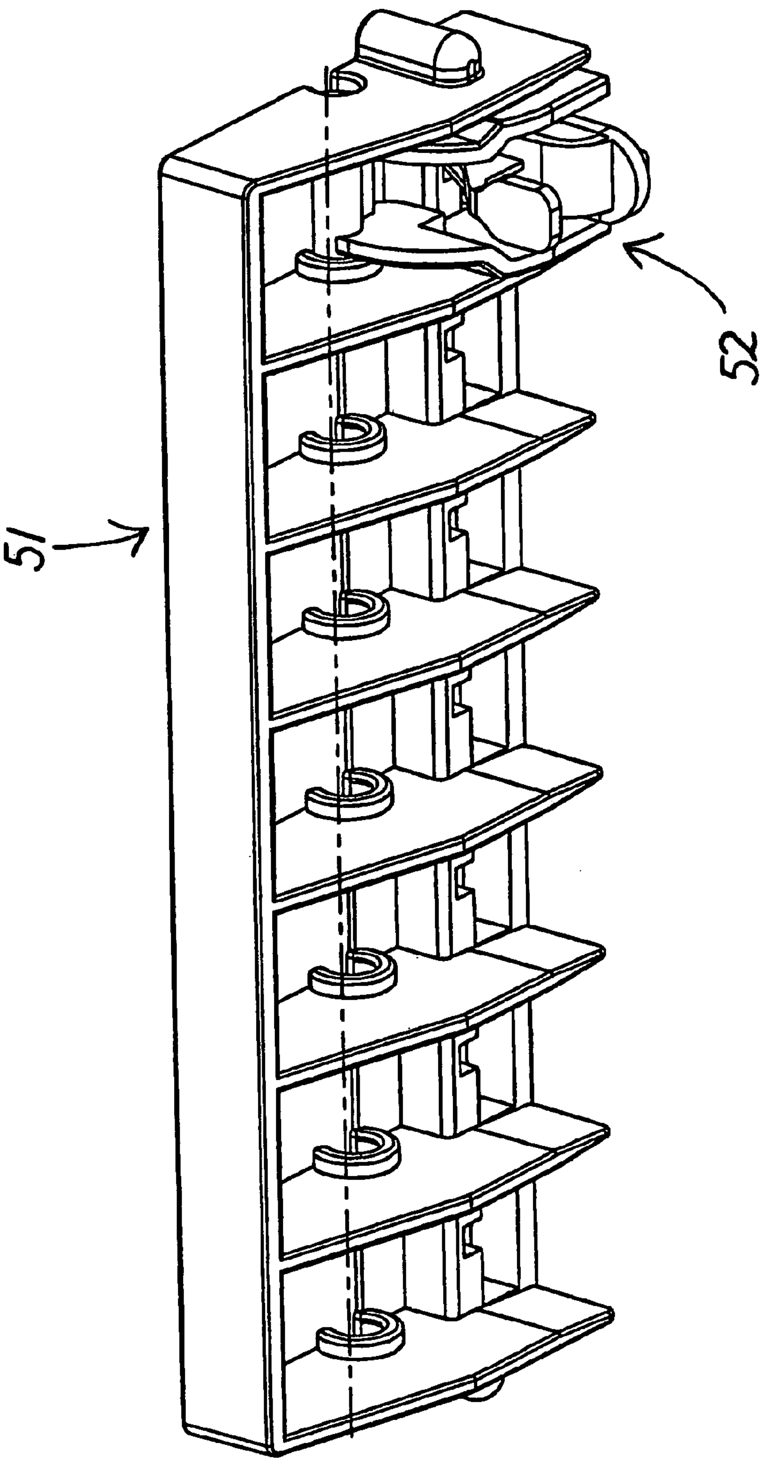
FIG. 5 illustrates a perspective view of an embodiment of the present invention.

FIG. 5 illustrates a perspective view of this embodiment. The interface card fastener 5 comprises said bracket 51 and said plurality of pivot assemblies 52, which the pivot assemblies 52 are set in the fastener chamber 515 of the bracket 51 to position the interface cards, and avoid problems of complex structure and hard operation.

Figure 6:
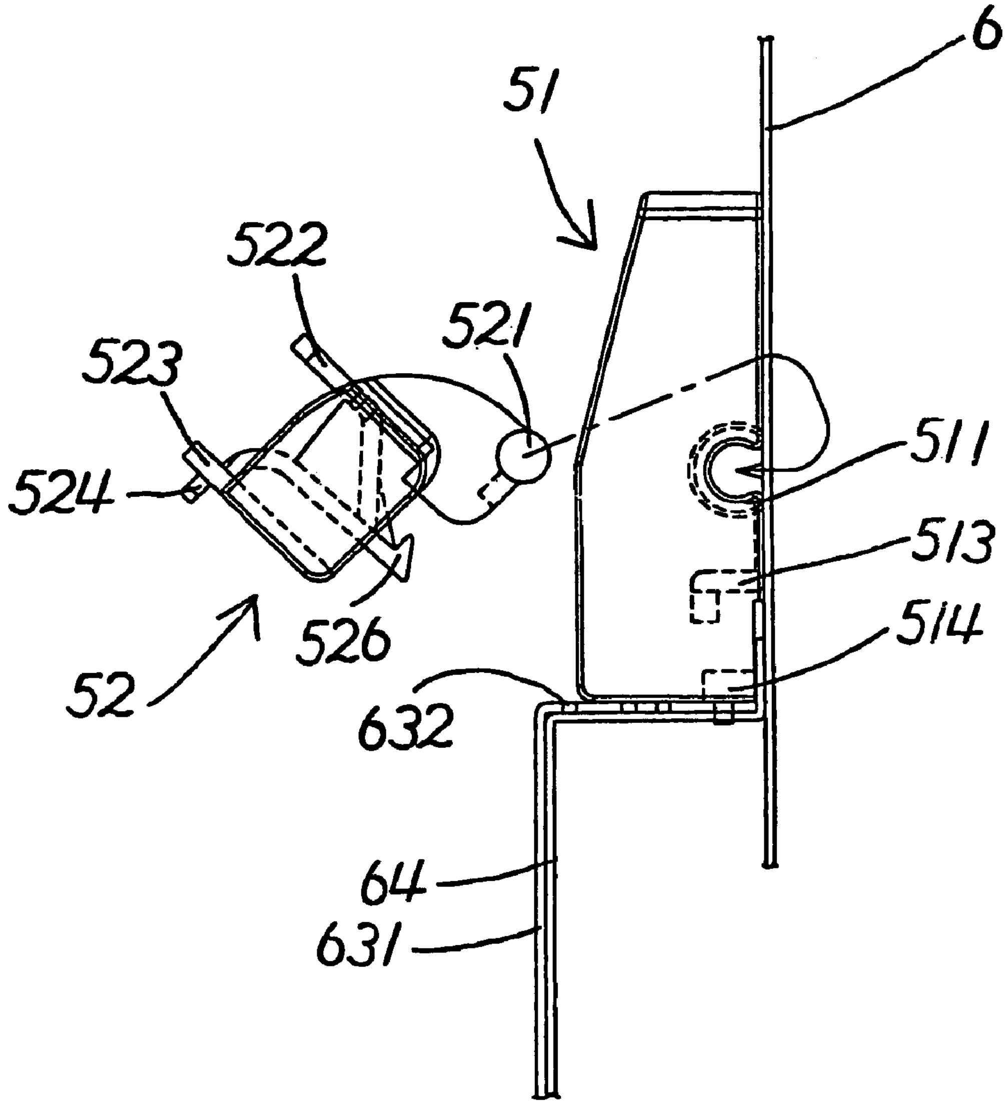
FIG. 6 illustrates an exploded perspective lateral view of an embodiment of the present invention.

FIG. 6 illustrates the exploded perspective lateral view of an embodiment of the present invention. The bracket 51 is set with screws or other applicable methods in a computer chassis 6 above a bulkhead 631, and comprises said L-shape hook 513 and said prominent crosspiece 514, each said inner frame 512 of the bracket 51 comprises said bearing hole 511. The pivot assembly 52 comprises said handle 522 and said press board 523. Said press board 523 comprises said engagement body 524 in front. The pivot assembly 52 also comprises said cannular pivot 521 on upside and said hook 526. To assemble the interface card fastener 5, the pivot 521 of the pivot assembly 52 is buckled into said bearing hole 511 of the bracket 51 (as the dotted line arrow indicated), so that the interface card fastener 5 presses an upper plate 632 of the bulkhead 631 with the corresponding pivot assembly 52.

Figure 7:
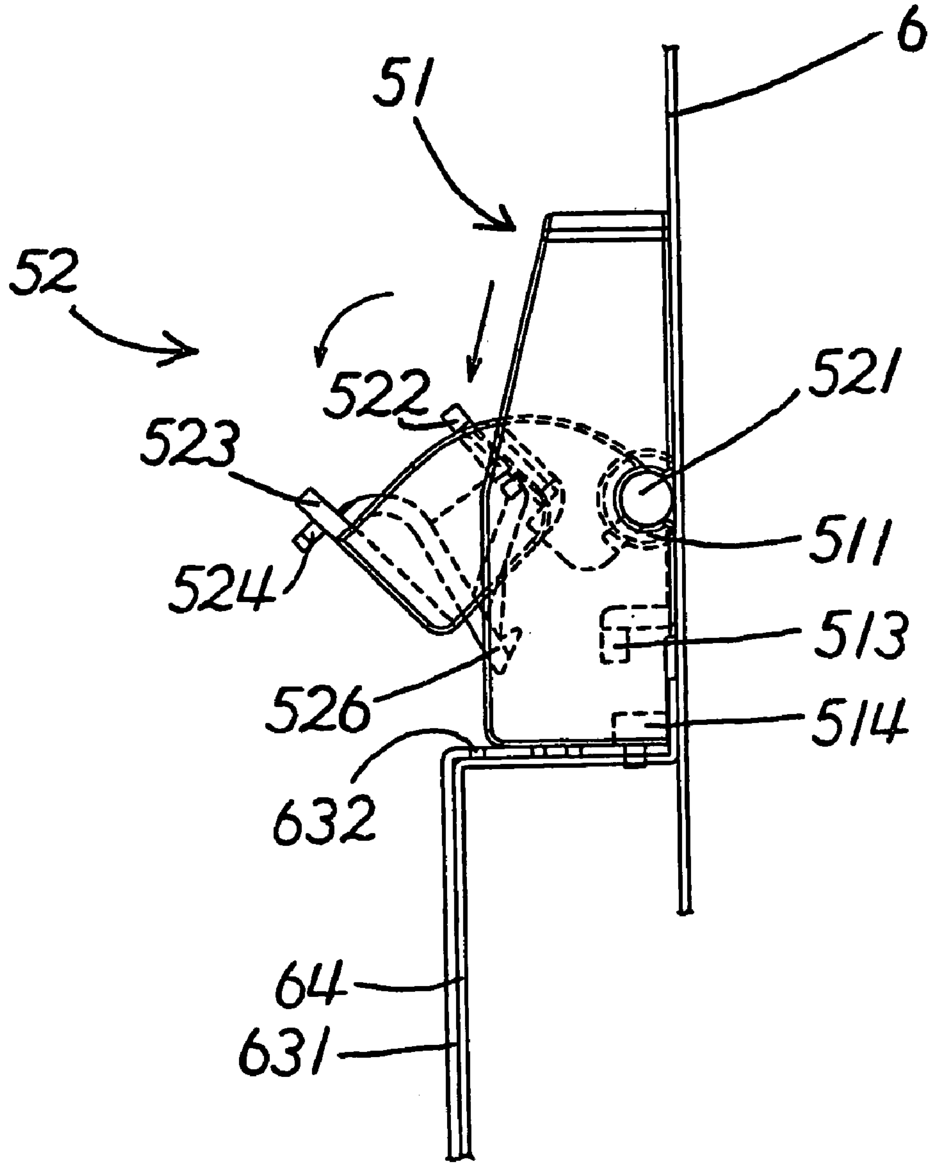
FIGS. 7, 8, 9 illustrate a perspective view of an embodiment of the present invention with rotation.
Figure 8:
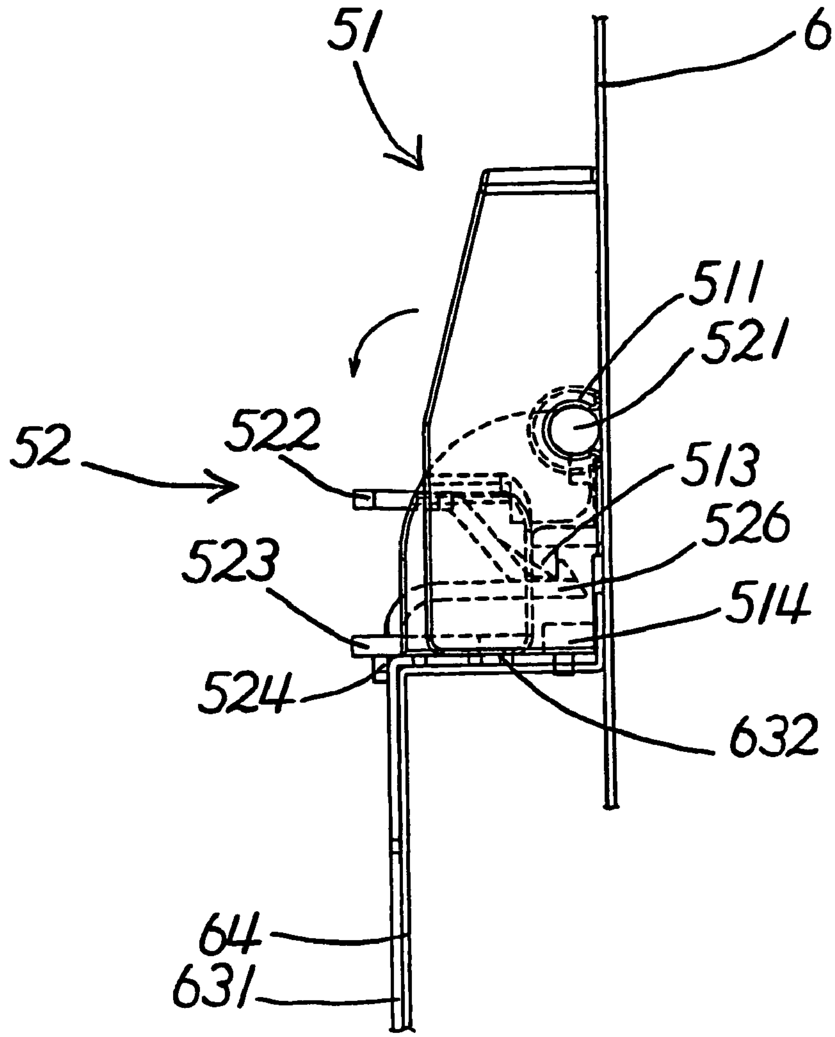
Figure 9:
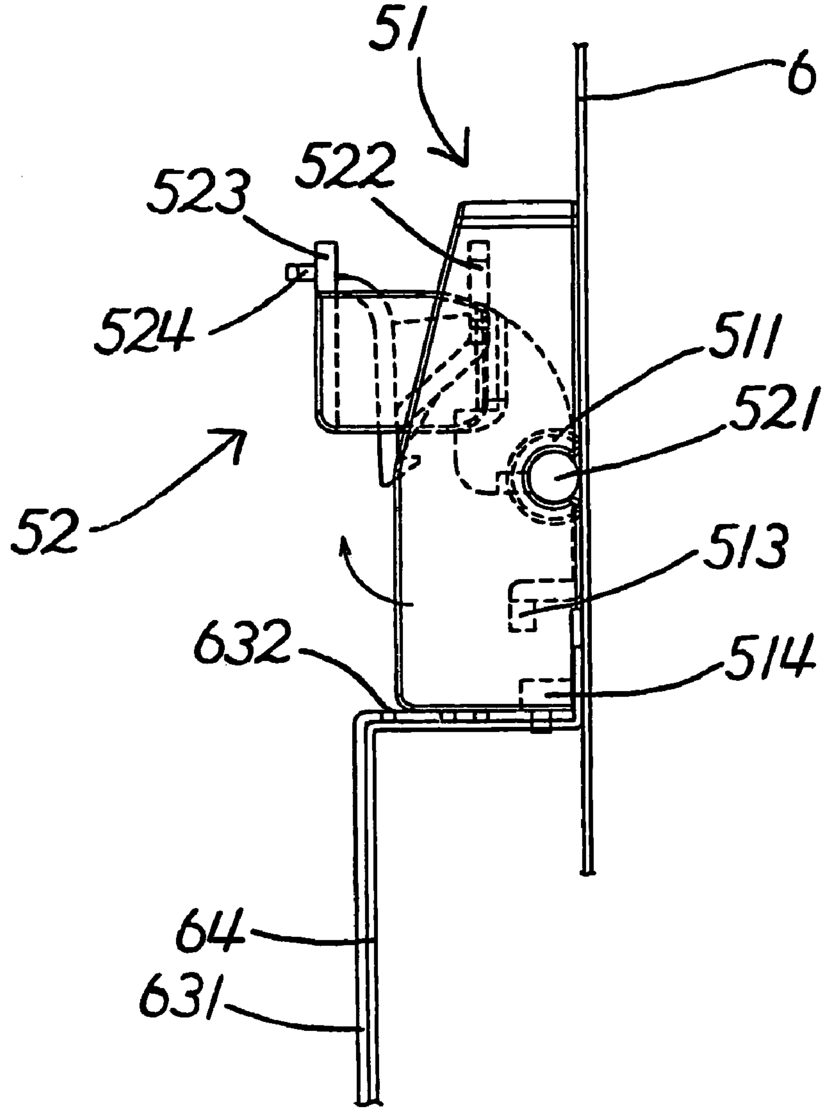
Figure 10:
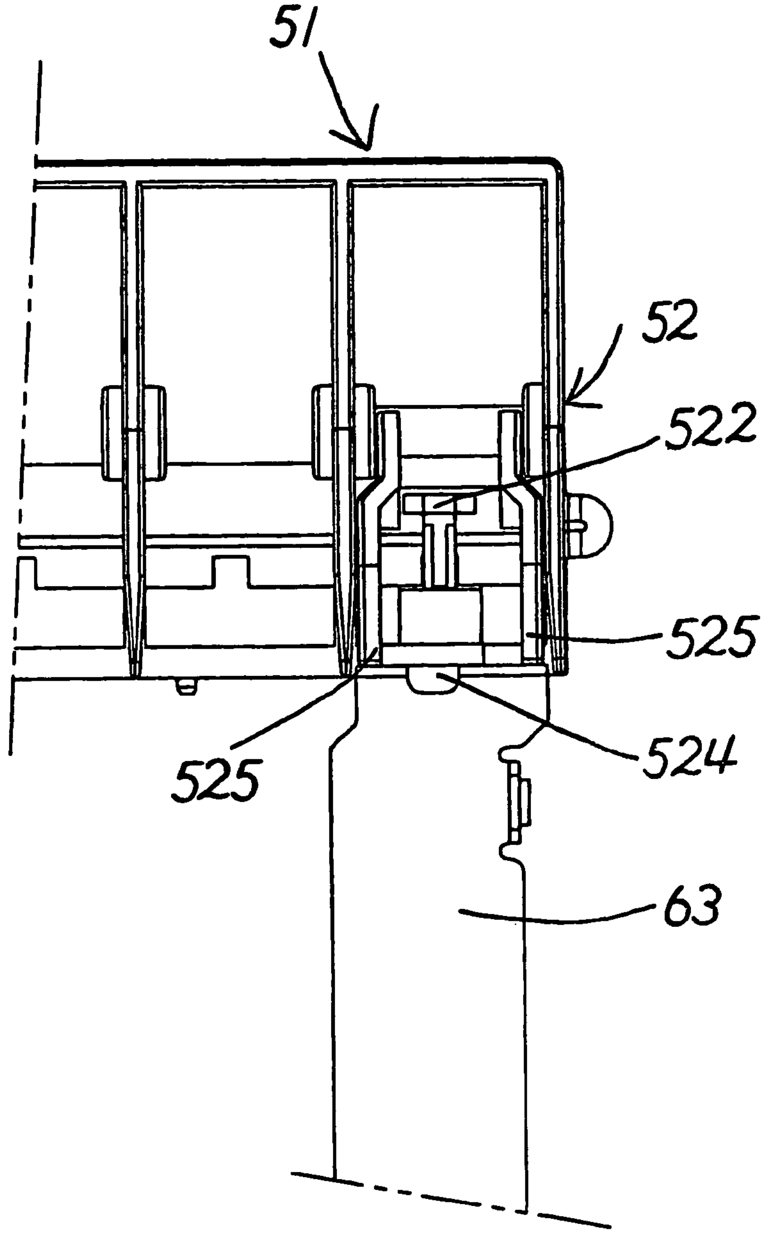
FIG. 10 illustrates a horizontal view of an embodiment of the present invention.

FIGS. 7, 8, 9 illustrate a perspective view of an embodiment of the present invention with rotation. When fastening an interface card, pushing said handle 522 of the pivot assembly 52 down, the hook 526 is easily engaging with the L-shape hook 513 of the bracket 51 to process interface card positioning. As the hook 526 is engaged with the L-shape hook 513, as shown in FIG. 8, end of said press board 523 of the pivot assembly 52 is close to said prominent crosspiece 514 of the bracket 51 with a buffer space for the hook 526 releasing from the L-shape hook 513, and when the pivot assembly 52 is continued pushed inside, the prominent crosspiece 514 will limit the further rotating of the pivot assembly 52. As the pivot assembly 52 is pushed to press the interface card, said aprons 525 (as shown in FIG. 10) and said engagement body 524 will fasten and position bulkhead 631 of the interface card to avoid loose. To release the interface card, further pushing the handle 522 of the pivot assembly 52 will lead the hook 526 down to release from the L-shape hook 513 and the pivot assembly 52 can be rotated to the opening release angle, which is up to 90° (as shown in FIG. 9).

FIG. 10 illustrates a horizontal view of an embodiment of the present invention. When the pivot assembly 52 presses an interface card 63, the both two aprons 525 and the engagement body 524 will position the bulkhead 631 of the interface card 63 stably to avoid loose by hitting or shaking.

Figure 11:
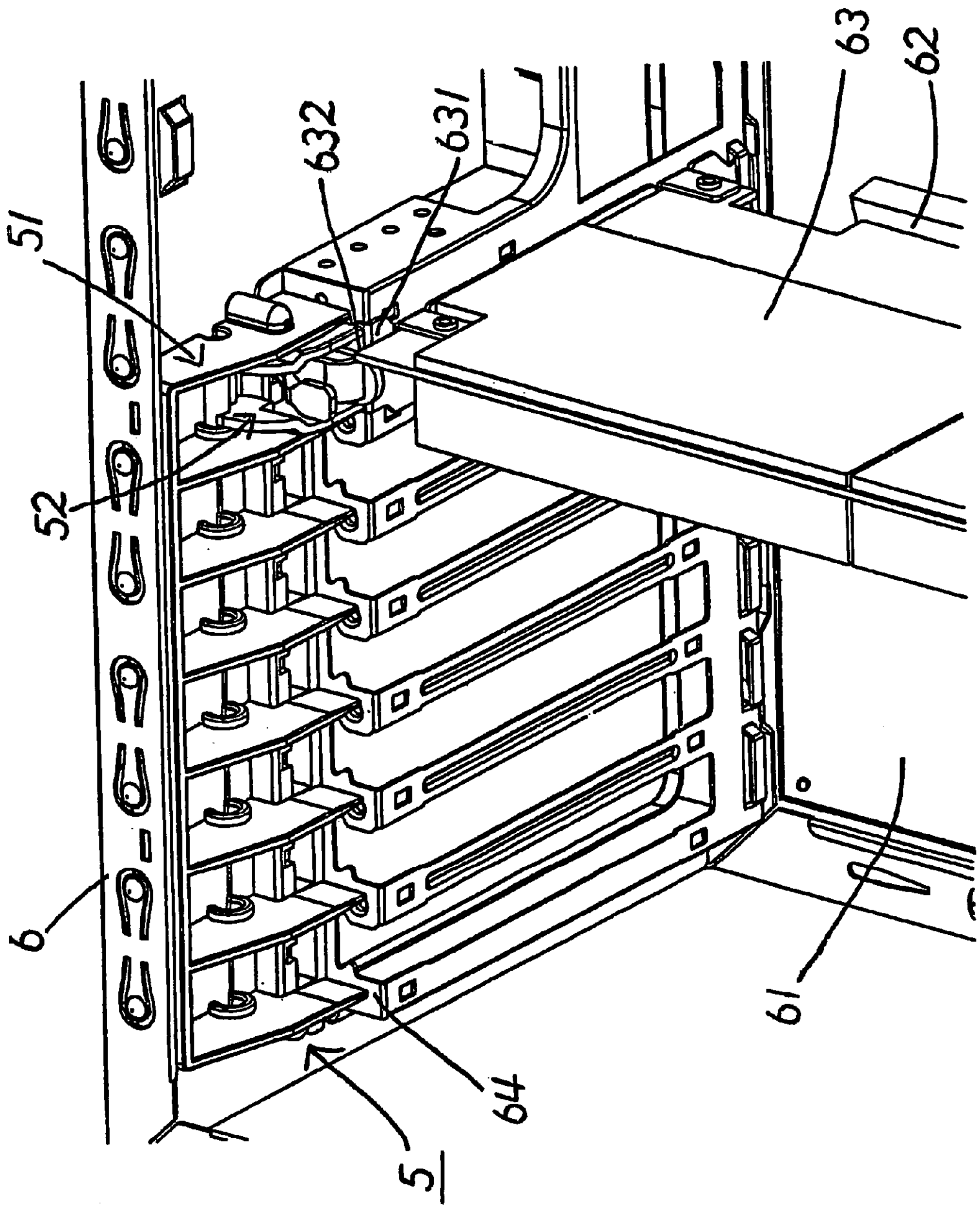
FIG. 11 illustrates a perspective view of an embodiment of the present invention engagement in the computer chassis.

FIG. 11 illustrates a perspective view of an embodiment of the present invention engagement in the computer chassis. The interface card fastener 5 is set in a computer system host or other electronic devices comprising interface cards. The host or device comprises a chassis 6, and a mainboard 61 set in the chassis 6. Said mainboard 61 comprises a plurality of expansion slots 62 for the interface cards 63. The chassis 6 comprises a frame 64 in inner corresponding to the expansion slots 62 and the interface card 63. Each the interface card 63 comprises a bulkhead 631 corresponding to the inner frame 64 of the chassis 6. The bracket 51 of the interface card 5 is set upon the frame 64 above the bulkhead 631 inside the chassis 6. Each the pivot assembly 52 is set into each corresponding the fastener chamber. The interface card fastener 5 fastens the interface card 63 by the pivot assembly pressing the upper plate 632 of the bulkhead 631 of the interface card 63, and the both two aprons 525 and the engagement body 524 of the pivot assembly 52 will position the bulkhead 631 of the interface card 63 stably. Pushing the handle 522 can easily hook the hook 526 into or release the hook 526 from the L-shape hook 513 to operate plugging position or unplugging of a single interface card 63.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications intend to be embraced within the scope of the invention as defined in the appended claims.

What is claimed is:

1. An interface card fastener, which is set in a computer system host or any other electronic device comprising interface card, comprising:

a bracket, fitting in a chassis upon a frame of the chassis above a plurality of expansion slots, which comprises a back frame with the chassis engagement and a plurality of inner frames extending out from said back frame; each two inner frames define a fastener chamber, and inside the back frame in each said fastener chamber comprises a horizontal extended L-shape hook;

a plurality of pivot assemblies, set and pivoted in said fastener chambers, which comprises a hook and a handle linked said hook, rotate in said fastener chambers respectively between a fastening or a release position of each the interface card;

which is characterized in pushing the handle to hook said linked hook with said L-shape hook or to unhook in operating each the single interface card position.

2. The interface card fastener of claim 1, wherein said inner frame of the bracket comprises a bearing hole, which is for said pivot assembly set to pivot in the fasten chamber.

3. The interface card fastener of claim 1, wherein said pivot assembly comprises a pivot, which is set into said bearing hole of the bracket, to rotate in a appropriate angle.

4. The interface card fastener of claim 1, wherein said bracket comprises a prominent crosspiece in an appropriate place below the L-shape hook to limit the rotation of the pivot assembly.

5. The interface card fastener of claim 1, wherein said pivot assembly comprises two aprons on both sides, and a press board in the bottom, which said press board comprises a engagement body 524 in front, to position the interface card.

6. The interface card fastener of claim 1, wherein the maximum rotation angle of said pivot assembly is 90°.

7. The interface card fastener of claim 1, wherein said computer system host or any other electronic device comprises a chassis and a mainboard set in the chassis, said mainboard comprises a plurality of expansion slots for interface cards, and said chassis comprises a frame to engage a bulkhead of the interface card.

* * * * *